US006340403B1

(12) United States Patent
Carey et al.

(10) Patent No.: US 6,340,403 B1
(45) Date of Patent: Jan. 22, 2002

(54) SOLAR CELL MODULE LAMINATION PROCESS

(75) Inventors: Paul G. Carey, Mountain View; Jesse B. Thompson, Brentwood; Randy C. Aceves, Tracy, all of CA (US)

(73) Assignee: The Regents of the University of California, Oakland, CA (US)

( * ) Notice: Subject to any disclaimer, the term of this patent is extended or adjusted under 35 U.S.C. 154(b) by 1524 days.

(21) Appl. No.: 08/538,838

(22) Filed: Oct. 4, 1995

Related U.S. Application Data

(63) Continuation of application No. 08/230,509, filed on Apr. 20, 1994, now abandoned.

(51) Int. Cl.[7] ................................................ B32B 31/00

(52) U.S. Cl. ........................ 156/182; 136/251; 156/246; 156/249; 156/312; 156/324; 156/329

(58) Field of Search ............................ 136/251; 437/2; 156/182, 324, 329, 249, 246, 312

(56) References Cited

U.S. PATENT DOCUMENTS 2,191,704 A * 2/1940 Bennett ...................... 156/230
3,970,502 A * 7/1976 Turner ........................ 156/312
4,056,422 A * 11/1977 Staats ......................... 156/312
4,083,097 A * 4/1978 Anagnostou et al. ....... 136/251
4,759,816 A * 7/1988 Kasper et al. ............. 156/246
5,238,519 A * 8/1993 Nath et al. .................. 136/251

FOREIGN PATENT DOCUMENTS

GB 2042802 * 9/1980 ................. 136/251

* cited by examiner

*Primary Examiner*—John J. Gallagher
(74) *Attorney, Agent, or Firm*—L. E. Carnahan; Alan H. Thompson

(57) ABSTRACT

A solar cell module lamination process using fluoropolymers to provide protection from adverse environmental conditions and thus enable more extended use of solar cells, particularly in space applications. A laminate of fluoropolymer material provides a hermetically sealed solar cell module structure that is flexible and very durable. The laminate is virtually chemically inert, highly transmissive in the visible spectrum, dimensionally stable at temperatures up to about 200° C. highly abrasion resistant, and exhibits very little ultra-violet degradation.

22 Claims, 3 Drawing Sheets

SOLAR CELL MODULE LAMINATION PROCESS

This is a Continuation In-Part of application Ser. No. 08/230,509 filed Apr. 20, 1994, now abandoned.

The United States Government has rights in this invention pursuant to Contract No. W-7405-ENG-48 between the United States Department of Energy and the University of California for the operation of Lawrence Livermore National Laboratory.

BACKGROUND OF THE INVENTION

1. Field of the Invention

The present invention relates to solar cells, particularly to solar cell modules which operates in hostile environments, and more particularly to a lamination Process for solar cell modules using fluoropolymer/adhesive sandwiching layers that encapsulate the solar cells and which provides the needed protection for solar cells operating in adverse environmental conditions.

2. Description of Related Art

Solar cells are being utilized in a wide variety of applications. Recently, substantial research and development efforts have been directed toward space applications for solar cells. One such use is for the solar plane Pathfinder, now under development and testing. Applications such as in Pathfinder require a high power to weight ratio solar array that must be protected from adverse environmental conditions. At high altitudes there is little to no attenuation of the ultra-violet (UV) portion of the solar spectrum in addition to extreme thermal variations. Thus, there has been a need for means to protect the solar cells from these adverse conditions without interfering with the operation or efficiency of the solar cells.

Various studies have been undertaken in an effort to develop a protective covering for high power to weight ratio solar arrays. After evaluation of various materials to provide the protective covering, which included various candidate polymers, it was discovered that fluoropolymers provided the protection needed without adverse effect on the solar cell operation. Thus, this invention utilizes fluoropolymers in a lamination process to produce a solar module laminate structure which can be utilized in arrays of solar cells having thicknesses up to 25 mils (625 μm), with the lamination encapsulating the cells. The result is a hermetically sealed planar solar cell array laminate structure. The process of this invention thus satisfies the above-referenced need by providing a hermetically sealed solar cell module laminate structure that is flexible and very durable, while enabling use of thin solar cells in hostile environments.

SUMMARY OF THE INVENTION

It is an object of the present invention to provide a process for lamination of solar cells.

A further object of the invention is to provide a solar cell module laminate structure that can be utilized in hostile environments.

A further object of the invention is to provide a lamination process which results in a hermetically sealed solar cell module laminate structure that is flexible and very durable.

Another object of the invention is to provide a solar cell module lamination process using fluoropolymers and silicone adhesive.

Another object of the invention is to provide a lamination process for high power to weight ratio solar cell arrays which provides protection of the array from adverse environmental conditions.

Other objects and advantages of the invention will become apparent from the following description and accompanying drawings. The invention involves laminating thin (under 25 mils or 625 μm) solar cells with a fluoropolymer using an adhesive material so as to encapsulate the solar cells in a hermetically sealed modular array. The thus produced solar cell array laminate enables the solar cells to withstand hostile conditions imposed by the environment, such as in space applications. More specifically the solar cell module fabrication is a multi-step process consisting of electrically interconnecting an array of solar cells having a thickness of up to 25 mils (625 μm) followed by lamination by at least two fluoropolymer/adhesive sandwiching layers to encapsulate the solar cell array, and produce a hermetically sealed solar cell module laminate structure.

BRIEF DESCRIPTION OF THE DRAWINGS

The accompanying drawings, which are incorporated into and form a part of the disclosure, illustrate embodiments of the invention and the fabrication process thereof and, together with the description, serve to explain the principles of the invention.

DETAILED DESCRIPTION OF THE INVENTION

Figure 1:
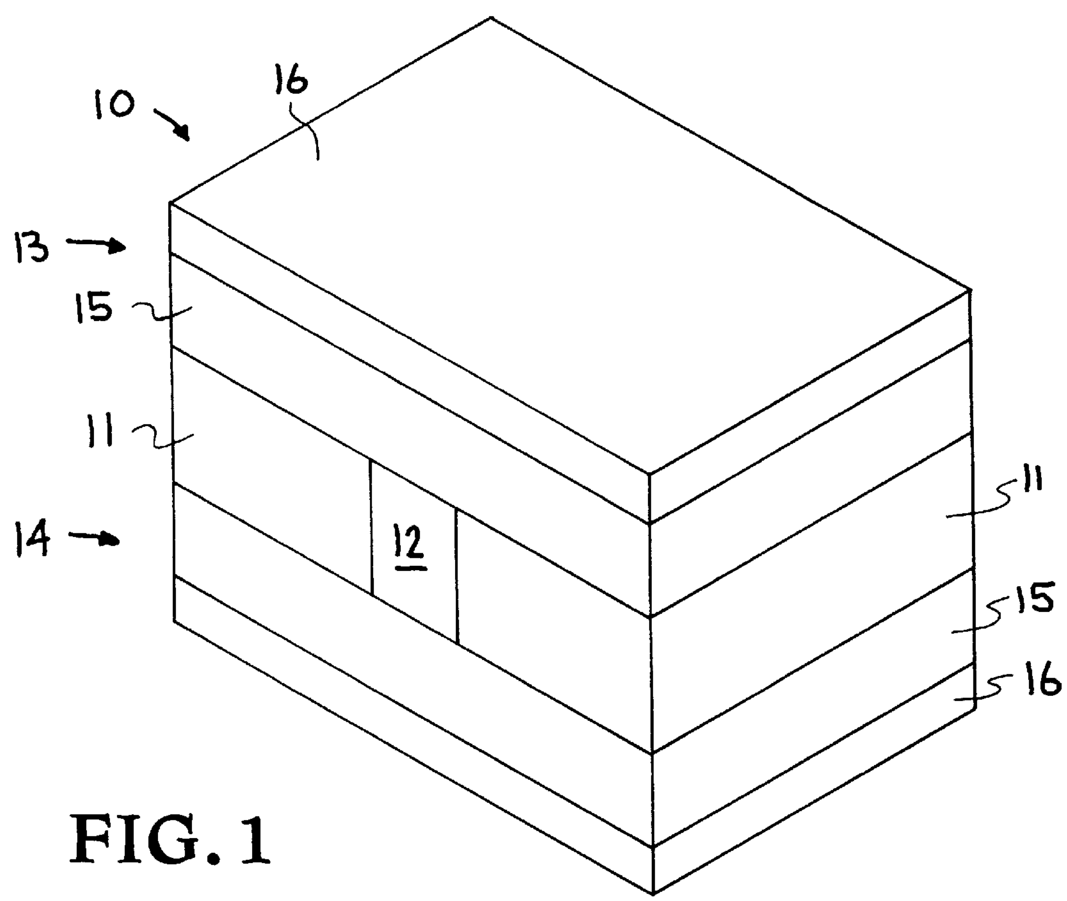
FIG. 1 illustrates in cross-section a five layer embodiment of a solar array laminate structure made in accordance with the invention.

The present invention involves a hermetically sealed solar cell module laminate structure that is flexible and very durable and has the ability to withstand the hostile conditions imposed by environments such as those in high altitudes. This invention provides a lamination process that can be used, for example, to encapsulate high power to weight ratio solar cell arrays for protecting such from adverse environmental conditions, and which enables use of such solar cell arrays in solar powered craft, such as to solar airplane Pathfinder and various types of spacecraft. At high altitudes there is little to no attenuation of the ultra-violet (UV) part of the solar spectrum in addition to extreme thermal variations, and the solar cell array laminate must be able to withstand these conditions to protect the solar cells.

Fluoropolymer layers which encapsulate the thin (not greater than 25 mils) solar cells provide the necessary environmental protection without adversely effecting the operation or efficiency of the solar cells. Fluoropolymers are virtually chemically inert, highly transmissive in the visible spectrum, dimensionally stable at temperatures up to 200° C., highly abrasion resistant, and exhibit very little UV degradation. The laminated solar cell module of this invention involves fabrication in a multi-step process consisting basically of electrically interconnecting an array of solar cells having thicknesses up to 25 mils (625 μm) into a desired module configuration, followed by lamination using fluoropolymer/adhesive sandwiching layers to encapsulate the solar cells, which results in a hermetically sealed solar cell module laminate structure.

In the embodiments of the solar module laminate structures illustrated in FIGS. 1 and 3, and described in detail hereinafter, silicon solar cells having a thickness of 100–125 μm were positioned 1250 μm (50 mils) apart as indicated by arrows and electrically interconnected, and at least two lamination layers, each consisting of a fluoropolymer film or layer, such as ethylene-chlorotrifluoroethlene (E-CTFE) having a thickness of 25 μm and an adhesive film or layer, such as a silicone adhesive having a thickness of 10 to 50 μm (0.4–2 mils), were placed on opposite sides of the interconnected solar cells, whereafter the two lamination layers are placed in a conventional laminator apparatus and the interconnected solar cell module is fed through the laminator apparatus resulting in a hermetically sealed solar cell module laminate structure. In the FIG. 1 embodiment, a layer or block of E-CTFE, for example is placed between the interconnected solar cells.

While the embodiments described and illustrated herein utilizes E-CTFE, other fluoropolymers may be used, such as polyvinylfluoride (PVF), polyvinylidene-fluoride (PVDF), ethylene-tetrafluoroethylene (E-TFE), polytetrafluoroethylene (PTFE), and polyfluoralkoxy (PFA). In another verification using PVF, such as made by DuPont under the trademark TEDLAR, as the fluoropolymer the layer had a thickness of 12.5 μm (0.5 mil). Also, besides pressure sensitive adhesives (i.e. silicone) other classes of adhesives, such as anaerobic, contact, and supported or unsupported film may be utilized depending on the type of fluoropolymer and the outer composition of the solar cells so as to provide the necessary adhesion between the cell and the fluoropolymer.

As seen in the FIG. 1 embodiment, the solar cell module laminate structure indicated generally at 10, consists of a plurality of individual solar cells 11, only two shown, which are electrically interconnected, as known in the art such as by soldering and encapsulated between two fluoropolymer/adhesive layers generally indicated at 13 and 14, each of the encapsulation layers being composed of a layer of adhesive 15 and a layer of fluoropolymer 16. A quantity, block, or layer 12 of fluoropolymer material is positioned intermediate the solar cells 11. As pointed at above, in this embodiment the solar cells 11 are silicon solar cells having a thickness of 100 μm (4 mil) and spaced 1250 μm (50 mil) apart, the adhesive layers 15 are composed of silicone adhesive having a thickness of 50 μm (2 mil), and the fluoropolymer layers 12 and 16 are composed of 50 μm (2 mil) thick E-CTFE, such as manufactured by Ausimont U.S.A., Inc. under the trademark HALAR. The silicone adhesive, for example, may be of the type manufactured by Dielectric Polymers, Inc. under the trademark TRANS-SIL, for example, but is a commercially available and widely used product. The thickness of the solar cells 11 may vary within the module 10 and be up to 25 mils thick (625 μm). The thickness of the adhesive layers 15 may vary from 10–50 μm (0.4–2 mil). The thickness of the fluoropolymer layers 16 may vary from 5–260 μm (0.2–5 mil). The thickness of either or both of the adhesive layers and the fluoropolymer layers 16 will depend on the specific materials involved, construction of the solar cells, and the applications in which the solar modular laminate structure is to be utilized.

Figure 2:
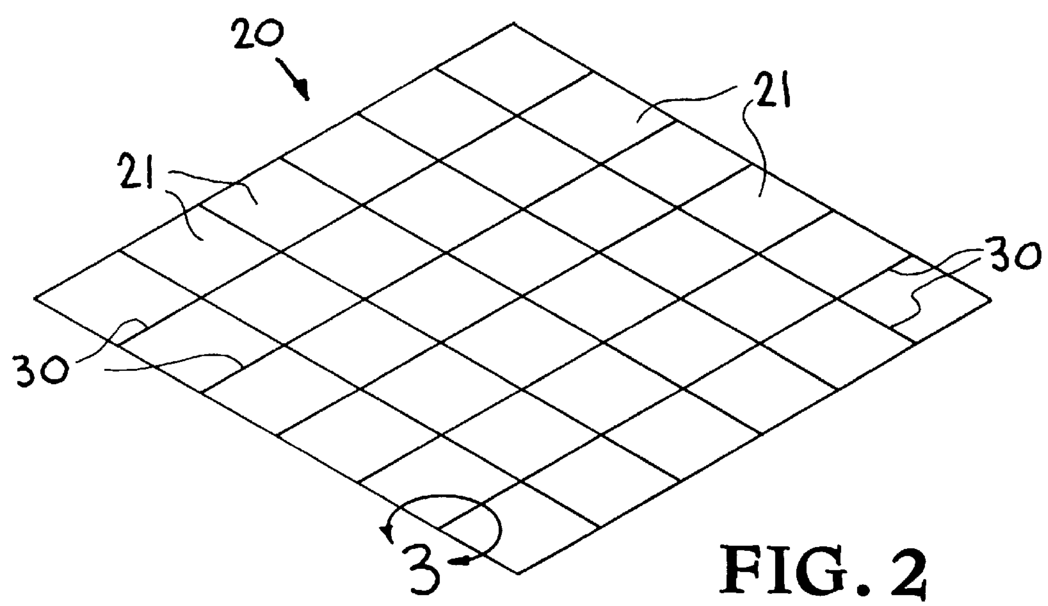
FIG. 2 is a perspective view of a solar cell module laminate structure made in accordance with the present invention.
Figure 3:
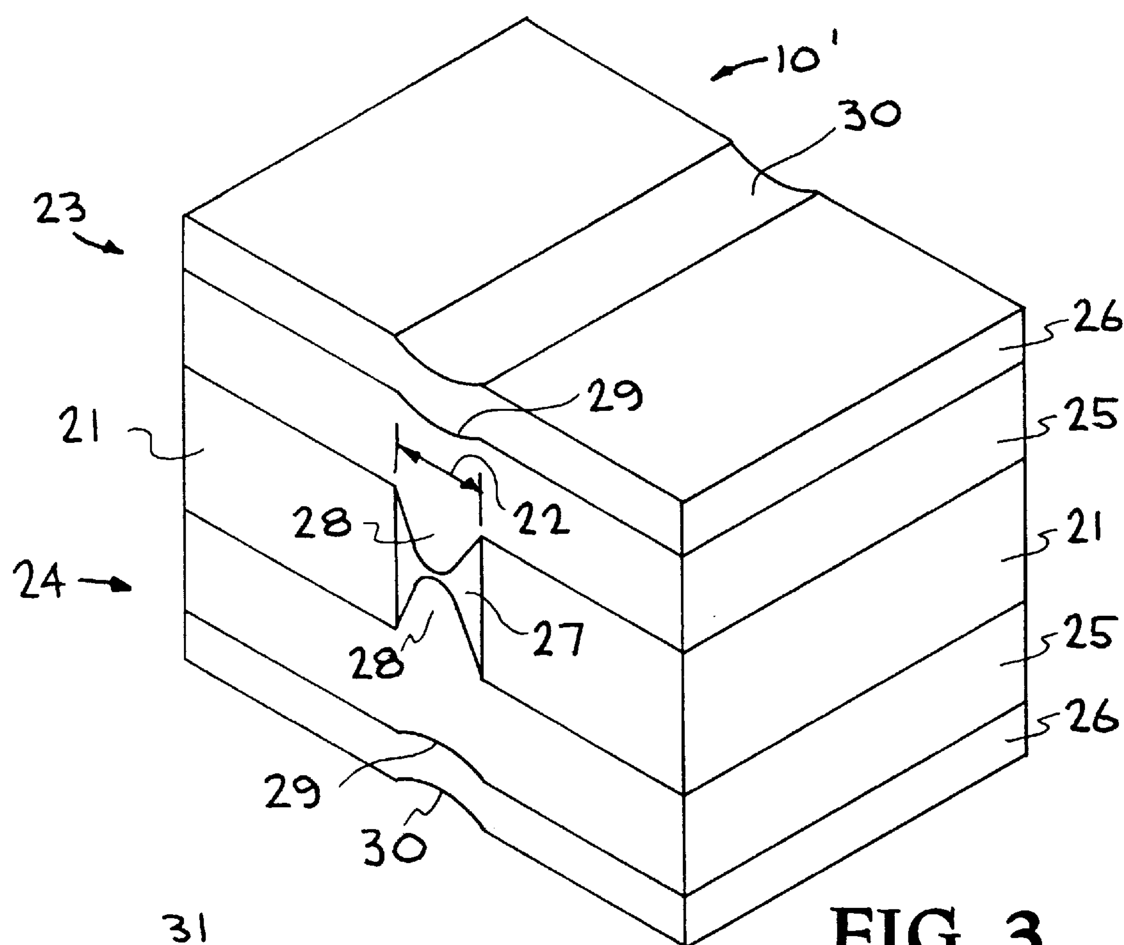
FIG. 3 illustrates an enlarged cross section of a preferred embodiment taken through a section of the FIG. 2 structure and illustrating the interconnected solar cells encapsulated in the fluoropolymer/adhesive laminate.

FIGS. 2 and 3 illustrate a preferred embodiment of the solar module laminate structure indicated at 10' in FIG. 3, with FIG. 2 illustrating a solar cell array, generally indicated at 20 and consists of a plurality of modules 10' each containing individual solar cells 21 which are electrically interconnected by techniques well known in the solar cell art, such as soldering. The array 20, as shown in FIG. 2, is composed of twenty-five (25) solar cells 21, spaced 1250 μm (50 mils) apart as indicated by the arrows 22 in FIG. 3. Note that the FIG. 3 embodiment eliminates the block 12 of fluoropolymer material illustrated in FIG. 1.

The embodiment of the solar cell module laminate structure 10' illustrated in FIG. 3 is similar to that of FIG. 1 except that the fluoropolymer layer 12 intermediate the cells 11 in FIG. 1 has been eliminated in that it was discovered that during the lamination process, the silicone adhesive substantially filled the space between the solar cells as seen in FIG. 3, and such was sufficient to prevent any movement of the solar cells, thereby reducing the material and costs of fabrication, as well as reducing the weight of the module due to the layer 12 of FIG. 1. As seen in FIG. 3, this embodiment comprises in plurality of solar cells 21, having a thickness of 125 μm, spaced 1250 μm (50 mils) apart as indicated by arrows 22, and encapsulated between two fluoropolymer/adhesive layers 23 and 24, each composed of a layer of adhesive 25 (50 μm thick) and a layer of fluoropolymer 26 (25 μm thick). Due to the movement of the adhesive 15 into the space 27 between solar cells 21, as indicated at 28, there are indentations 29 and 30 in each of the layers 23 and 24, and such indentations are shown in the FIG. 2 array 20. As pointed out above, the adhesive portions 28 in space 27 is sufficient to prevent movement of the solar cells 21. Also, the adhesive layers 25 in the FIG. 3 embodiment may have a thickness in the range of 10–50 μm, the fluoropolymer layers 26 may have a thickness of up to 25 mils, and the spacing between solar cells 21 may range from 50–2000 μm (2–80 mils). The process for fabricating the embodiment of FIG. 1 involves laminating five (5) layers that encapsulates the silicon solar cells 11. Initially, layers 16 of E-CTFE are laminated to unsupported layers 15 of silicone adhesive 15 to form the top and bottom fluoropolymer/adhesive layers or laminates 13 and 14. However, these laminated layers may be formed as described with respect to FIGS. 4 and 5. The thickness of the layers 15 and 16 are on the order of 25 to 50 μm (1 to 2 mils). A block, quantity, or layer 12 of E-CTFE of the same thickness as the space between the solar cells 11 is die-cut to the same real dimensions as the solar cells 11. This die-cut layer 12 is then laminated to the bottom laminate 14, forming an "egg-crate" type assembly. The solar cells 11 are then placed into the resultant voids or regions formed between the layers 12. Electrical interconnection between the solar cells 11 is then accomplished, and the top laminate 13 is then laminated, as described hereinafter, to form the finished array, similar to FIG. 2.

By way of example, the solar module fabrication process for the preferred embodiment involves laminating four layers that encapsulate the silicon solar cells, as shown in FIGS. 2 and 3. Initially a layer 26 of fluoropolymer material is laminated to an unsupported adhesive layer 25 to form the laminate for the top and bottom layers 23 and 24 of the solar cell module 10'. In verifications of this invention E-CTFE was used as the flouropolymer layers 26 and silicone adhesive was used as the adhesive layers 25, with the thickness of the E-CTFE being 25 μm (1 mil) and the thickness of the silicone adhesive being 50 μm (2 mil), but any thickness of the fluoropolymer layer 16 up to 25 mils may be used, as well as any thickness of adhesive from 10–50 μm and greater. While the solar cells 21 used in verification had a thickness of 125 $\mu$m, solar cells having thicknesses up to 625 $\mu$m (25 mils) may be laminated by the process of this invention.

Figure 4:
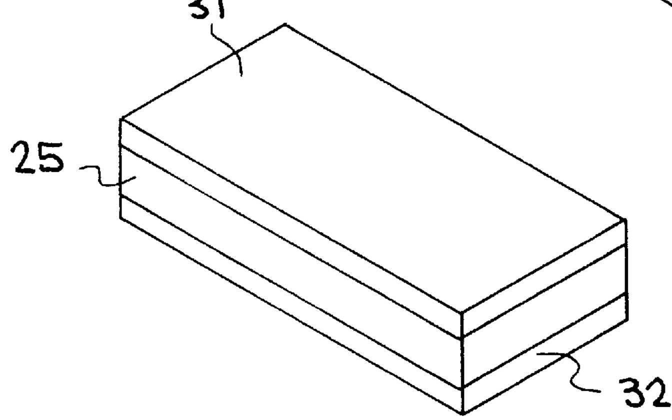
FIG. 4 illustrates the silicone adhesive as provided for use in the lamination process.

The laminates 23 and 24 are formed as described hereinafter with respect to FIGS. 4 and 5, with the fluoropolymer (E-CTFE) layer or film 26 being 25 $\mu$m (1 mil) and the unsupported silicon adhesive layer or film 25 being 50 $\mu$m (2 mils) in thickness. Together they add up to 225 gm/m$^2$ (0.046 lb/ft$^2$) for the top and bottom laminates 23 and 24. The layers or films 25 and 26 are obtained separately and then laminated together. The silicone adhesive 25, used in the verification testing, for example, comes as shown in FIG. 4 sandwiched between two polyethylene (PE) release liners 31 and 32. Where the layer 26 is composed of PVF having a thickness of 12.5 $\mu$m (0.5 mil) with the silicon adhesive layer 25 being 50 $\mu$m (2 mils), they add up to 179 gm/m$^2$ (0.037 lb/ft$^2$).

The sandwiched adhesive of FIG. 4, may for example include a 2 mil (50 $\mu$m) pressure sensitive silicone adhesive film 25 sandwiched between clear 2 mil (50 $\mu$m) polyester film release liners 31 and 32 as made under the trademark TRAN-SIL, manufacture by Dielectric Polymers, Inc., Holyoke, Mass. This silicone adhesive is designed for applications requiring chemical resistance, excellent bond strength and resistance to extreme temperatures from −300F. (−185° C.) to 500F. (260° C.), and may be used in intermittent temperature operations up to 700F.

Figure 5:
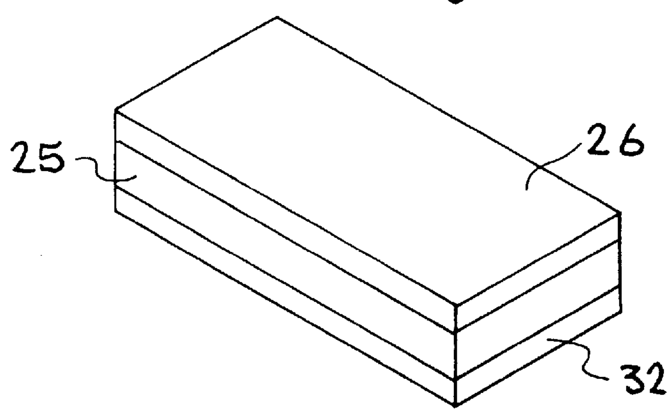
FIG. 5 illustrates the silicone adhesive of FIG. 4 after initial processing in accordance with the invention.

As seen in FIG. 5, the upper PE release liner 1 of FIG. 4 is removed and replaced by a layer or film 26 of a fluoropolymer, such as E-CTFE, manufactured under the trademark HALAR by Ausimont U.S.A., Inc. or PVF manufactured under the trademark TEDLAR by DuPont. This forms the laminate structures 23 and 24 of FIG. 3.

The process of this invention involves laminating electrically connected solar cells 21 between the top and bottom fluoropolymer/silicone adhesive layer 23 and 24.

The solar cells 21 are placed in their desired module configuration and electrically interconnected to form an array. In the embodiment illustrated in FIG. 2, the array is composed of twenty-five (25) solar cells 21, spaced 1250 $\mu$m (50 mils) apart as indicated by arrows 22 (see FIG. 3), and electrically interconnected, such as by soldering or other conventionally known process.

Broadly, the lamination process involves the array of electrically connected solar cells 21 being fed through the rollers of a conventional laminator apparatus, with the temperature of the rollers being 25° C. (room temperature), the laminate 23 and 24 each having been previously positioned in the laminator apparatus, which places (secures) the laminate on the top and bottom of the array as it passes through the apparatus to form the array 20 of FIG. 2. The resulting array is then trimmed to size. Finally, the hermetic sealing of the array is enhanced by again feeding it through the laminator apparatus with the rollers at a temperature of 40–60° C., which results in a hermetically sealed solar cell module laminate structure that is flexible and very durable, and capable of withstanding hostile conditions, such as imposed by high altitudes.

Figure 6:
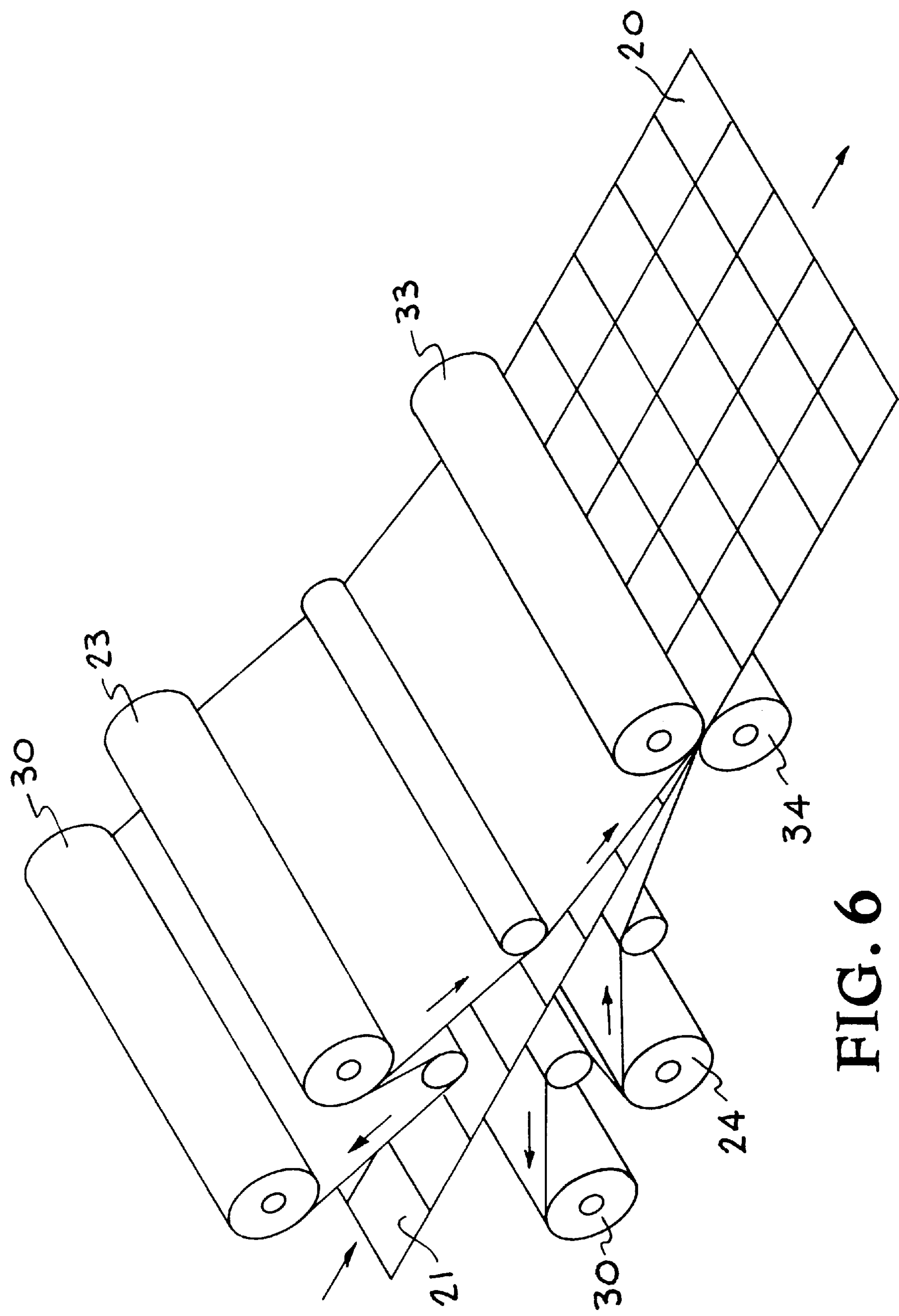
FIG. 6 schematically illustrates a portion of the solar array lamination process.

The lamination process is better understood by reference to FIG. 6. As the release liners 30, top and bottom, are removed, the top and bottom laminates 23 and 24 are fed between heated laminating rollers 33 and 34 of a conventional laminator apparatus. The array of electrically interconnected solar cells 21 is then fed through the rollers 33 and 34 intermediate the laminates 23 and 24 forming the array 20 which is hermetically sealed by the top and bottom laminates or layers 23 and 24. The array 20 passes through the rollers twice. The first pass at room temperature, for example, which causes the solar cells 21 of array 20 to be laminated to the top and bottom laminate layers 23 and 24. The second pass is at 120–140° F. (40–60° C.) and causes the silicone adhesive to reflow into space 27 between cells 21 and hermetically seal the solar array 20.

While specific examples of the thickness of the solar cells, fluoropolymer layers, and the silicon adhesive layers have been set forth, the broad range of solar cell thickness is 2–25 mils, with the preferred range being 2–14 mils; the broad range of the fluoropolymer layers is 0.5–5 mil with the preferred range being 0.2–2 mil; and the broad range of the silicon adhesive is 0.5–5 mils with the preferred range of 0.2–2 mils.

It has thus been shown that the present invention provides a solar module laminate structure and process for fabricating same. The thus formed laminate structure provides a solar cell array with the necessary protection to enable the array to operate in adverse environmental conditions without adversely effecting to operation or efficiency of the solar cells. While the solar cell module laminate structure has particular application in high altitude uses, due to the ability to withstand hostile conditions imposed by various types of environment, it enables to utilization of solar cells in a wider variety of applications, thus significantly advancing the state of the art. Also it is recognized that the lamination process need not be limited to the encapsulation of solar cells, but other components or devices may be encapulated by the process.

Although particular materials, parameters, applications, and fabrication process operations have been described and/or illustrate, such is not intended to be limiting, but are set forth only for description and example. Modifications and changes in the laminate structure as well as the fabrication process therefore will become apparent to those skilled in the art, and it is intended that the scope of this invention only be limited by the scope of the appended claims.

We claim:

1. A process for encapsulating a device without adversely affecting the operation and efficiency of the device while protecting it from adverse environmental conditions, comprising:

forming a pair of fluoropolymer laminates consisting of three layers by positioning only a layer of fluoropolymer material on a layer of adhesive material having a release liner on an opposite side thereof;

positioning the thus formed pair of laminates in a laminator apparatus;

removing the release liner of each of the pair of fluoropolymer laminates; and passing the device to be encapsulated through the laminator apparatus such that the adhesive material and the fluoropolymer material of each of the pair of laminates are secured on opposite sides of the device.

2. The process of claim 1, additionally including hermetically sealing the device within the pair of fluoropolymer laminates by passing the laminated device through the laminator apparatus a second time.

3. The process of claim 1, wherein the material is selected from the fluoropolymer group consisting of E-CTFE, PVF, E-TFE, PTFE, and PFA.

4. The process of claim 3, wherein the adhesive material is selected from the group consisting of pressure sensitive, anaerobic, contact and film-supported and unsupported materials.

5. The process of claim 4, wherein the fluoropolymer material is composed of E-CTFE, and the adhesive material is composed of silicone.

6. The process of claim 5, wherein the E-CTFE has a thickness of about 25 $\mu$m, and the silicone adhesive has a thickness of about 10–50 $\mu$m.

7. The process of claim 1, wherein the fluoropolymer material and the adhesive material each has a thickness of up to 5 mils.

8. The process of claim 4, wherein the fluoropolymer material is composed of PVF, and the adhesive material is composed of silicone.

9. The process of claim 8, wherein the PVF has a thickness of about 12.5 $\mu$m, and the silicone adhesive has a thickness of about 10–50 $\mu$m.

10. The process of claim 1, additionally including forming the device from a plurality of electrically interconnected solar cells, and providing a quantity of fluoropolymer material intermediate the solar cells, prior to encapsulation.

11. The process of claim 1, wherein forming each of the fluoropolymer laminates is carried out by:

providing an adhesive material having release layers on opposite sides thereof;

removing a release layer from one side of the adhesive material; and positioning a fluoropolymer material on the one side of the adhesive material.

12. A solar cell module lamination process, comprising:

forming an array of electrically connected solar cells, forming a fluoropolymer laminates each composed only of a pair of fluoropolymer material, an adhesive material, and a release material, and laminating the array of electrically connected solar cells with the pair of fluoropolymer laminate after removing only the release material thereof on at least opposite sides of the solar cell array forming a module of laminated interconnected solar cells.

13. The lamination process of claim 12, additionally including producing the fluoropolymer pair of laminates by positioning only a fluoropolymer material on one side of the adhesive material having a release layer on an opposite side thereof.

14. The lamination process of claim 12, additionally including hermetically sealing the solar cell array with the fluoropolymer laminate after the solar cell array has been laminated.

15. The lamination process of claim 12, additionally including positioning a quantity of fluoropolymer material intermediate the solar cells prior to laminating.

16. The laminating process of claim 15, additionally including forming an egg-crate type structure, and positioning the solar cells in void regions of the structure.

17. The lamination process of claim 12, wherein laminating the array of electrically connected solar cells with the fluoropolymer laminate is carried out in a laminator apparatus including laminating rollers having a selected temperature.

18. The lamination process of claim 17, wherein the temperature of the rollers is about room temperature.

19. The lamination process of claim 17, wherein the temperature of the rollers is about 25° C.

20. The lamination process of claim 18, additionally including hermetically sealing the fluoropolymer laminate which is laminated on the array of solar cells by passing the thus and formed laminated module back through a laminator apparatus with the rollers having a temperature of about 40–60° C.

21. The lamination process of claim 13, wherein the fluoropolymer material is selected from PVF and E-CTFE and the adhesive material is silicone adhesive.

22. The process of claim 12, wherein forming each of the pair of fluoropolymer laminates is carried out by:

providing an adhesive material having release layers on each side thereof;

removing a release layer from one side of the adhesive material; and positioning a fluoropolymer material on the one side of the adhesive material.

* * * * *